(12) United States Patent
McCullough et al.

(10) Patent No.: US 6,596,469 B2
(45) Date of Patent: *Jul. 22, 2003

(54) METHOD OF MAKING MASKS AND ELECTRONIC PARTS

(75) Inventors: Christopher David McCullough, West Yorkshire (GB); Kevin Barry Ray, Leeds (GB); Alan Stanley Victor Monk, Cheshire (GB); John David Riches, West Yorkshire (GB); Anthony Paul Kitson, West Yorkshire (GB); Gareth Rhodri Parsons, West Yorkshire (GB); David Stephen Riley, West Yorkshire (GB); Peter Andrew Reath Bennett, West Yorkshire (GB); Richard David Hoare, Stockton-on-Tees (GB)

(73) Assignee: Kodak Polychrome Graphics, LLC, Norwalk, CT (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/503,095

(22) Filed: Feb. 11, 2000

(65) Prior Publication Data
US 2002/0136961 A1 Sep. 26, 2002

Related U.S. Application Data

(63) Continuation of application No. PCT/GB98/02418, filed on Aug. 11, 1998.

(30) Foreign Application Priority Data

Aug. 14, 1997 (GB) .............................................. 9717120
Oct. 29, 1997 (GB) .............................................. 9722861
May 1, 1998 (GB) .............................................. 9809346

(51) Int. Cl.$^7$ .............................. G03C 1/76; G03C 5/00
(52) U.S. Cl. .................... 430/330; 430/311; 430/270.1
(58) Field of Search .................... 430/5, 270.1, 271.1, 430/272.1, 273.1, 277.1, 300, 302, 311, 313, 319, 317, 318, 322, 325, 329, 330

(56) References Cited

U.S. PATENT DOCUMENTS

| | | | |
|---|---|---|---|
| 4,115,120 A | 9/1978 | Dyer et al. ................... 96/36.2 |
| 4,708,925 A | 11/1987 | Newman ..................... 430/270 |
| 5,102,775 A | 4/1992 | Okuhara et al. ............ 430/287 |
| 5,275,917 A | 1/1994 | Inaishi ....................... 430/288 |
| 5,328,811 A | 7/1994 | Brestel ....................... 430/325 |
| 5,372,907 A | 12/1994 | Haley et al. ................ 430/157 |
| 5,466,557 A | 11/1995 | Haley et al. ................ 430/278 |
| 5,512,418 A | 4/1996 | Ma ........................... 430/271.1 |
| 5,514,521 A | 5/1996 | Kobayashi ................ 430/281.1 |
| 5,563,011 A | 10/1996 | Shipley .......................... 430/7 |
| 5,609,995 A | 3/1997 | Akram et al. ............... 430/327 |
| 5,641,608 A | 6/1997 | Grunwald et al. .......... 430/302 |
| 5,824,451 A | 10/1998 | Aoai et al. ............... 430/270.1 |
| 6,004,720 A | 12/1999 | Takechi et al. .......... 430/270.1 |
| 6,130,026 A | * 10/2000 | Bennett et al. ............. 430/303 |

FOREIGN PATENT DOCUMENTS

| | | |
|---|---|---|
| EP | 0001429 | 4/1979 |
| EP | 0163478 | 12/1985 |
| EP | 0557138 | 8/1993 |
| EP | 0708372 | 4/1996 |
| EP | 0750230 | 12/1996 |
| EP | 0784233 | 7/1997 |
| EP | 0795420 | 9/1997 |
| EP | 0823327 | 2/1998 |
| EP | 0864420 | 9/1998 |
| EP | 0901902 | 3/1999 |
| GB | 1245924 | 9/1971 |
| GB | 1260662 | 1/1972 |
| JP | 1108543 | 4/1989 |
| JP | 943847 | 2/1997 |
| WO | 97399894 | 10/1997 |
| WO | 9842507 | 10/1998 |

OTHER PUBLICATIONS

*Patent Abstracts of Japan*, Abstract of JP 07234511, Sep. 5, 1995, 1 page.
*Patent Abstracts of Japan*, Abstract of JP 07261407, Oct. 13, 1995, 1 page.
William S. DeForest, "Photoresist Materials and Presses", McGraw–Hill (1975), pp. 230–231.
Derwent Abstract (1983)–No. 83–805348 of JP 58162389.

* cited by examiner

*Primary Examiner*—Mark F. Huff
*Assistant Examiner*—Saleha R. Mohamedulla
(74) *Attorney, Agent, or Firm*—Faegre & Benson LLP

(57) ABSTRACT

A method of making a mask or an electronic part, for example a printed circuit, comprises the steps of delivering heat in a desired pattern to a precursor of the mask or electronic part, the precursor comprising a surface coated with a coating, the coating comprising a heat-sensitive composition itself comprising an aqueous developer soluble polymeric substance and a compound which reduces the aqueous developer solubility of the polymeric substance, wherein the aqueous developer solubility of the composition is not increased by incident UV radiation but is increased by the delivery of heat; then developing the precursor to remove the heat-sensitive composition in regions to which the heat was delivered. In the case of a printed circuit precursor the surface may be then etched in conventional manner to yield the required printed circuit.

23 Claims, No Drawings

METHOD OF MAKING MASKS AND ELECTRONIC PARTS

CROSS-REFERENCE TO RELATED APPLICATIONS

This application is a continuation of PCT/GB98/02418 filed on Aug. 11, 1998, which was published in English on Feb. 25, 1999, which in turn claims priority from GB 9717120.1, filed Aug. 14, 1997, GB 9722861.3, filed Oct. 29, 1997, and GB 9809346.1, filed May 1, 1998.

This invention relates to masks and electronic parts and to their production using positive working radiation sensitive compositions.

We have developed novel radiation sensitive compositions and in our earlier-filed patent, application PCT/GB97/01117, published on Oct. 30, 1997, we disclose these novel compositions and their use as imagable coatings for lithographic printing forms. We have now determined that such compositions are suitable as radiation sensitive coatings for masks and for printed circuit and other electronic parts.

The coatings used in pattern forming methods for electronic parts such as printed circuits are classified into two types: negative working and positive working. After exposure to radiation and development, the coating pattern is used as a screen for forming the patterns onto the underlying electronic elements—for example by etching an underlying copper foil. Due to the high resolution demands and the requirements of high resistance to etching techniques, positive working systems are widely used. In particular, in the main there have been used alkali developable positive working coatings mainly composed of alkali-soluble novolac resins as disclosed in J. C. Streiter, Kodak Microelectronics Seminar Proceedings, 1979, p. 116. The primary active component of such positive working compositions, both in the context of lithographic printing forms and electronic parts, is a naphthoquinonediazide (NQD) derivative.

The types of electronic parts whose manufacture may use a radiation sensitive coating include printed wiring boards (PWBs), thick- and thin-film circuits, comprising passive elements such as resistors, capacitors and inductors; multi-chip devices (MDCs); integrated circuits (ICs); and active semiconductor devices. The electronic parts may suitably comprise conductors, for example copper board; semiconductors, for example silicon or germanium; and insulators, for example silica as a surface layer with silicon beneath, with the silica being selectively etched away to expose portions of the silicon beneath (a step in the manufacture of e.g. field effect transistors). In relation to masks, a required pattern may be formed in the coating on the mask precursor, which is then used as a mask in a later processing step, in forming a pattern on, for example, a printing or electronic part substrate.

An example of a positive working, direct laser addressable coating is described in U.S. Pat. No. 4,708,925. This patent describes a composition which comprises a phenolic resin and a radiation-sensitive onium salt. As described in the patent, the interaction of the phenolic resin and the onium salt produces an alkali-insoluble composition which is restored to alkali solubility upon photolytic decomposition of the onium salt. The compositions can be utilised as positive working compositions or as negative working compositions using additional process steps between exposure and development as detailed in British Patent No. 2,082,339. The compositions are intrinsically sensitive to UV radiation and can be additionally sensitised to visible and infra-red radiation. The compositions are primarily for use as printing plate coatings but there is mention that they may be used as positive coatings for printed circuit boards.

The compositions described in U.S. Pat. No. 4,708,925 cannot be handled extensively without due consideration for the lighting conditions in the working area. Special safe-lighting conditions are required which prevent unwanted exposure to UV radiation. The precursors coated with such compositions may be utilised for limited periods only in white light working conditions dependent on the output spectrum of the white light source. It would be desirable to utilise digital imaging hardware and to handle the precursors in an unrestricted, white light environment in order to streamline workflows and UV sensitivity would be a disadvantage in these areas. In addition, white light handling would provide an improved working environment in areas which currently have to be under restrictive safelight conditions.

Moreover, the compositions of U.S. Pat. No. 4,708,925 have constraints on their components which create difficulties in optimising properties to provide optimum performance across a range of performance parameters. The presence of functional groups which would crosslink the phenolic resin in the presence of onium salts upon irradiation cannot be allowed, either as a modification to the alkali soluble resin or as additional components in the composition, as this would lead to reduced solubilisation on exposure.

The heat-sensitive composition we have discovered, initially proposed as a coating for a printing form precursor and now proposed also as a coating for a mask or for an electronic part precursor (without the necessity for the composition to be ink-accepting) is suitable for application as a heat-sensitive positive working composition for heat mode imaging which does not exhibit the disadvantages of the prior art as described hereinabove.

The composition of the present invention is heat-sensitive in that localised heating of the composition, preferably by suitable radiation, causes an increase in the aqueous developer solubility of the exposed areas.

Therefore according to one aspect of the present invention there is provided a method of making a mask or an electronic part, the method comprising the steps of:

a) delivering heat selectively to regions of a precursor of the mask or electronic part, the precursor comprising a surface coated with a coating, the coating comprising a heat-sensitive composition itself comprising an aqueous developer soluble polymeric substance (hereinafter called the "active polymer") and a compound which reduces the aqueous developer solubility of the polymeric substance (hereinafter called the "reversible insolubiliser compound") wherein the aqueous developer solubility of the composition is not increased by incident UV radiation but is increased by the said delivery of heat; and b) developing the precursor in a said aqueous developer in order to remove heat-sensitive composition in regions to which said heat was delivered.

Preferably the removal of heat-sensitive composition is complete at those regions, so as to reveal the said surface at those regions, but certain methods, in particular to make certain types of mask, may require the removal of only a proportion of the full depth of the composition where heated, rather than the full depth thereof.

The electronic part may, for example, be any of the electronic parts set out earlier in this specification. The said surface may thus be a semiconductor in which case the method may involve one or more subsequent doping steps selectively in regions in which the composition has been removed, such doping steps being for example by vapour phase, liquid immersion or by ion implantation methods. It may be an insulator which is etched to reveal a conductive or semiconductor layer below. For example it may be silica etched to reveal silicon. Alternatively it may be a conductive surface on which a wiring pattern is to be formed, for example by etching the printed circuit precursor in an etchant to remove said conductive surface selectively in the said regions.

A said surface of an electronic part precursor referred to herein is different from the base used for lithographic printing plates, the context in which the compositions were first proposed. In particular, a said surface is not an aluminium plate which has undergone the usual anodic graining and post-anodic treatments well known in the lithographic art for enabling a radiation sensitive composition to be coated thereon and for the surface of the plate to function as a printing surface. More preferably it is not a metallic plate treated for use as a printing plate. More preferably when the surface is conductive it is a copper or a copper-rich alloy. Preferably such a surface is supported by an insulating substrate. The insulating substrate is suitably a dimensionally stable plastics board, for example of epoxy resin reinforced by glass fibres.

Whilst the said surface defined herein may be an insulator requiring to be selectively subjected to etching in order to remove portions thereof to reveal an electroactive layer beneath it, preferably the said surface itself is an electroactive layer. By electroactive we mean a conductor, a semiconductor or a material which when doped functions as a semiconductor. Most preferably the said surface is a conductor.

The invention may also be applied to the manufacture of masks. Masks are used in some imaging methods, whether in the context of printing or circuit board substrates, with the required resist pattern being formed in the coating on the mask precursor, which is then used as a mask or screen, in a later processing step. One example of such a process is the flexographic process, as described in "Advances in Printing Plate Technology" by S. Doyle, ISBN 1858020875. The invention may in particular be applied to the manufacture of masks requiring the removal of only a proportion of the full depth of the composition where heated, rather than the full depth thereof.

The heat-sensitive compositions described herein may be coated onto a film, forming a mask precursor, and heat-imaged, and developed, to provide a mask. The mask precursor may be imaged to leave the composition thereon in different depths at different locations, after development. The resulting mask may then usefully be applied over a printing substrate and flood exposed, for example using a UV light source.

According to a second aspect of the invention there is provided a precursor for a mask or an electronic part, which mask or electronic part comprises a surface (not being an aluminium surface which has undergone electrograining, anodising and post-anodic treatments) and a coating comprising a heat-sensitive composition coated on the said surface, the heat-sensitive composition comprising an aqueous developer soluble polymeric substance and a compound which reduces the aqueous developer solubility of the polymeric substance, wherein the aqueous developer solubility of the composition is increased on heating and the aqueous developer solubility of the composition is not increased by incident UV radiation.

In order to increase the sensitivity of the heat-sensitive compositions used in the present invention it is beneficial to include an additional component, namely a radiation absorbing compound capable of absorbing incident radiation and converting it to heat, hereinafter called a "radiation absorbing compound". A radiation absorbing compound is suitably a dye or pigment.

Therefore according to a further aspect of the present invention there is provided a precursor for a mask or an electronic part wherein said coating is suitably adapted to preferentially absorb radiation and convert said radiation to heat, in accordance with the method defined above.

Therefore according to a preferred embodiment of the present invention there is provided a heat-sensitive positive working precursor for a mask or an electronic part which has on said surface a coating, the coating comprising a heat-sensitive composition comprising a said active polymer, a said reversible insolubiliser compound and a said radiation absorbing compound, characterised in that the aqueous developer solubility of the composition is increased on heating and that the aqueous developer solubility of the composition is not increased by incident UV radiation.

In a further preferred embodiment of the present invention there is provided a heat-sensitive positive working precursor for a mask or an electronic part wherein the said coating includes an additional layer disposed beneath the heat-sensitive composition, wherein the additional layer comprises a radiation absorbing compound.

In a further preferred embodiment of the present invention there is provided a heat-sensitive positive working precursor for a mask or an electronic part which has on said surface a coating comprising a heat-sensitive composition comprising a said active polymer and a said reversible insolubiliser compound which is also a said radiation absorbing compound characterised in that the aqueous developer solubility of the composition is increased on heating and that the aqueous developer solubility of the composition is not increased by incident UV radiation.

In the specification, when we state that the aqueous developer solubility of the composition is increased on heating we mean that it is substantially increased, i.e. by an amount useful in a mask or electronic part manufacturing process. When we state that the aqueous developer solubility of the composition is not increased by incident UV radiation we mean that it is not substantially increased (that is, by an amount which would mean that UV safelighting conditions would have to be employed) over a time span applicable to the manufacturing process involved—which in the case of electronic part manufacture means over a time span of at least 2 hours, preferably at least 1 day, and most preferably (because sometimes copper boards are coated, and then imaged over the next week), for at least 7 days. Insubstantial increases in solubility due to incident UV radiation, arising from ambient light, for example arising from daylight or ordinary white lights such as fluorescent strip lights, over such periods, may be tolerated within the scope of this invention.

Thus in accordance with the present invention a mask or an electronic part, whether a circuit or a circuit device, is obtained after heat-mode imaging and processing. The aqueous developer solubility of the coated composition is much reduced with respect to the solubility of the active polymer alone. On subsequent exposure to suitable radiation the heated areas of the composition are rendered more soluble in the developing solution. Therefore on imagewise exposure there is a change in the solubility differential of the unexposed composition and of the exposed composition. Thus, in the exposed areas the composition is dissolved, preferably to the extent of revealing the underlying surface. The revealed areas of the underlying surface can then be selectively subjected to a desired treatment, which in the case of electronic parts may entail etching, doping and/or deposition, and/or making electrical connections thereto.

Desirably, after such treatment, the remaining areas of the composition are then removed. This may be achieved by heating the precursor to solubilise the remaining areas of the composition, then subjecting it to a developer; or, preferably, by subjecting it to a stripper liquid, for example acetone or strong alkali, for example an alkali metal hydroxide.

In accordance with a further aspect of the invention there is provided a kit for the production of electronic parts, the kit comprising a composition as defined herein, having at least an active polymeric substance and a reversible solubiliser compound, and surface material, the composition being in liquid form suitable for application to the surface material, to provide it on drying with said coating. Preferably the surface material is a conductive material. Suitably the kit includes a developer. Suitably the kit includes a stripper liquid.

We will now describe the formation of a desired pattern on a precursor, by means of a method as defined above. The composition thereon is such that it is patternwise solubilized by heat, itself delivered patternwise. In broad terms there are three ways in which heat can be patternwise delivered to the composition, in use. These are:

the direct delivery of heat by a heated body, by conduction. For example the composition may be contacted by a heat stylus; or the reverse face of a metallic support surface onto which the composition has been coated may be contacted by a heat stylus.

the use of incident electromagnetic radiation to expose the composition, the electromagnetic radiation being converted to heat, either directly (which is preferred) or by a chemical reaction undergone by a component of the composition.

the use of charged-particle radiation, for example electron beam radiation. Clearly, at the fundamental level the charged-particle mode and the electromagnetic mode are convergent; but the distinction is clear at the practical level.

A coated precursor for an electronic part of the invention may be heat imaged indirectly by exposure to a short duration of high intensity radiation transmitted or reflected from the background areas of a graphic original located in contact with the recording material.

In preferred methods of the invention electromagnetic radiation is used to expose the composition, the wavelength thereof entirely or predominantly exceeding 500 nm. Preferably, it is of wavelength entirely or predominantly exceeding 600 nm. More preferably it is of wavelength entirely or predominantly exceeding 700 nm. Most preferably it is of wavelength entirely or predominantly exceeding 800 nm. Suitably it is of wavelength entirely or predominantly below 1400 nm. More preferably it is of wavelength entirely or predominantly below 1200 nm. Most preferably it is of wavelength entirely or predominantly below 1150 nm, especially below 1100 nm. Thus, suitably it is of wavelength entirely or predominantly in the range 600 to 1400 nm, more preferably 700 to 1200 nm, most preferably 800 to 1150 nm, especially 800 to 1100 nm. The electromagnetic radiation is converted to heat, either directly or by a chemical reaction undergone by a component of the composition. The electromagnetic radiation could for example be infra-red or visible radiation. Infra-red radiation is preferred.

Preferably the radiation is delivered by a laser.

Whilst the applicants do not wish to be limited by any theoretical explanation of how their invention operates, it is believed that a thermally frangible complex is formed between the active polymer and the reversible insolubiliser compound. This complex is believed to be reversibly formed and can be broken by application of heat to the complex to restore aqueous developer solubility to the composition. It is thought that polymeric substances suitable for use in the current invention comprise electron rich functional groups when uncomplexed and that suitable compounds which reduce the aqueous developer solubility of the polymeric substance are electron poor. It is not thought that decomposition of components within the composition is required, or that any substantial decomposition has occurred in any examples tested to date.

Examples of functional groups of said active polymers suitable for application in this invention include hydroxy, carboxylic acid, amino, amide and maleiimide functional groups. A wide range of polymeric materials are suitable for use in the present invention examples of which include phenolic resins; copolymers of 4-hydroxystyrene, for example with 3-methyl-4-hydroxystyrene or 4-methoxystyrene; copolymers of (meth)acrylic acid, for example with styrene; copolymers of maleiimide, for example with styrene; hydroxy or carboxy functionalised celluloses; copolymers of maleic anhydride, for example with styrene; partially hydrolysed polymers of maleic anhydride.

Novolac resins are useful in this invention, suitably being condensation reaction products between appropriate phenols, for example phenol itself, C-alkyl substituted phenols (including cresols, xylenols, p-tert-butyl-phenol, p-phenylphenol and nonyl phenols), diphenols e.g. bisphenol-A (2,2-bis(4-hydroxyphenyl)propane), and appropriate aldehydes, for example formaldehyde, chloral, acetaldehyde and furfuraldehyde. The type of catalyst and the molar ratio of the reactants used in the preparation of phenolic resins determines their molecular structure and therefore the physical properties of the resin. An aldehyde:phenol ratio between 0.5:1 and 1:1, preferably 0.5:1 to 0.8:1 and an acid catalyst is used to prepare those phenolic resins generally known as novolacs which are thermoplastic in character. Higher aldehyde:phenol ratios of more then 1:1 to 3:1, and a basic catalyst would give rise to a class of phenolic resins known as resoles, and these are characterised by their ability to be thermally hardened at elevated temperatures.

Most preferably the active polymer is a phenolic resin. Particularly useful phenolic resins in this invention are the condensation products from the interaction between phenol, C-alkyl substituted phenols (such as cresols and p-tert-butyl-phenol), diphenols (such as bisphenol-A) and aldehydes (such as formaldehyde). Dependent on the preparation route for the condensation a range of phenolic materials with varying structures and properties can be formed. Particularly useful in this invention are novolac resins, resole resins and novolac/resole resin mixtures. Examples of suitable novolac resins have the following general structure.

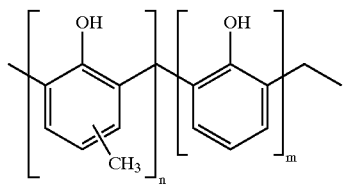

A large number of compounds which reduce the aqueous solubility of suitable polymeric substances have been located for use as reversible insolubiliser compounds.

A useful class of reversible insolubiliser compounds are nitrogen containing compounds wherein at least one nitrogen atom is either quarternised, or incorporated in a heterocyclic ring, or both quarternised and incorporated in a heterocyclic ring.

Examples of useful quarternised nitrogen containing compounds are triaryl methane dyes such as Crystal Violet (CI basic violet 3) and Ethyl Violet and tetraalkyl ammonium compounds such as Cetrimide.

More preferably the reversible insolubiliser compound is a nitrogen-containing heterocyclic compound.

Examples of suitable nitrogen-containing heterocyclic compounds are quinoline and triazols, such as 1,2,4-triazol.

Most preferably the reversible insolubiliser compound is a quarternised heterocyclic compound.

Examples of suitable quarternised heterocyclic compounds are imidazoline compounds, such as Monazoline C, Monazoline O, Monazoline CY and Monazoline T all of which are manufactured by Mona Industries, quinolinium compounds, such as 1-ethyl-2-methyl quinolinium iodide and 1-ethyl-4-methyl quinolinium iodide, and benzothiazolium compounds, such as 3-ethyl-2-methyl benzothiazolium iodide, and pyridinium compounds, such as cetyl pyridinium bromide, ethyl viologen dibromide and fluoropyridinium tetrafluoroborate.

Usefully the quinolinium or benzothiazolium compounds are cationic cyanine dyes, such as Quinoldine Blue, 3-ethyl-2-[3-(3-ethyl-2(3H)-benzothiazoylidene)-2-methyl-1-propenyl]benzothiazolium iodide, and the compound of formula

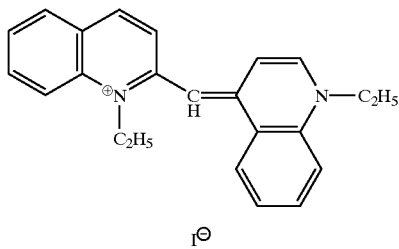

A further useful class of reversible insolubiliser compounds are carbonyl functional group containing compounds, for example a flavone compound.

Examples of suitable carbonyl containing compounds are α-naphthoflavone, β-naphthoflavone, 2,3-diphenyl-1-indeneone, flavone, flavanone, xanthone, benzophenone, N-(4-bromobutyl)phthalimide and phenanthrenequinone.

The reversible insolubilising compound may be a compound of general formula

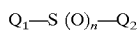

where $Q_1$ represents an optionally substituted phenyl or alkyl group, n represents 0, 1 or 2, and $Q_2$ represents a halogen atom or an alkoxy group. Preferably $Q_1$ represents a $C_{1-4}$ alkyl phenyl group, for example a tolyl group, or a $C_{1-4}$ alkyl group. Preferably n represents 1 or, especially, 2. Preferably $Q_2$ represents a chlorine atom or a $C_{1-4}$ alkoxy group, especially an ethoxy group. The compound may suitably be ethyl-p-toluene sulfonate or p-toluenesulfonyl chloride.

Another useful reversible insolubiliser compound is acridine orange base (CI solvent orange 15).

Other useful reversible insolubiliser compounds are ferrocenium compounds, such as ferrocenium hexafluorophosphate.

In addition to the active polymer which interacts with the reversible insolubiliser compound in the manner defined herein the composition may contain a polymeric substance which does not thus interact. In such a composition having a blend of polymeric substances it should be noted that the active polymer can be present in a lower amount, by weight, than the additional polymeric substance(s). Suitably the active polymer is present in an amount of at least 10%, preferably at least 25%, more preferably at least 50%, by total weight of the polymer substances present in the composition. Most preferably, however, the active polymer is present to the exclusion of any polymeric substance which does not thus interact.

One suitable polymeric substance which does not thus interact is a polyvinyl($C_{1-4}$alkyl) ether compound, especially polyvinylethylether (PVEE). We have found such a compound to give a useful enhancement of the mechanical properties of the coating, in particular an improvement in its flexibility. When present such a compound is suitably present in an amount in the range 5–30%, by total weight of polymeric substances present in the composition.

The major proportion of the composition is preferably constituted by polymeric substance(s), including the active polymer and, when present, an additional polymeric substance which does not thus interact. Preferably a minor proportion of the composition is constituted by the reversible insolubiliser compound.

A major proportion as defined herein is suitably at least 50%, preferably at least 65%, most preferably at least 80%, of the total weight of the composition.

A minor proportion as defined herein is suitably less than 50%, preferably up to 20%, most preferably up to 15%, of the total weight of the composition.

Suitably the reversible insolubiliser compound constitutes at least 0.25%, preferably at least 0.5%, more preferably at least 1%, most preferably at least 2%; and preferably up to 25%, more preferably up to 15%, and most preferably up to 10%, of the total weight of the composition.

There may be more than one polymeric substance which interacts with the said compound. References herein to the proportion of such substance(s) are to their total content. Likewise there may be more than one polymeric substance which does not thus interact. References herein to the proportion of such substance(s) are to their total content. Likewise there may be more than one reversible insolubiliser compound. References herein to the proportion of such compound(s) are to their total content.

The aqueous developer composition is dependent on the nature of the polymeric substance. Common components of aqueous lithographic developers are surfactants, chelating agents such as salts of ethylenediamine tetraacetic acid, organic solvents such as benzyl alcohol, and alkaline components such as inorganic metasilicates, organic metasilicates, hydroxides or bicarbonates.

Preferably the aqueous developer is an alkaline developer containing inorganic or organic metasilicate or being an alkali metal hydroxide. We have found an alkali metal hydroxide, in particular sodium hydroxide, to be suitable both as a developer and as a stripper.

A large number of compounds, or combinations thereof, can be utilised as radiation absorbing compounds in preferred embodiments of the present invention.

In preferred embodiments the radiation absorbing compound absorbs infra-red radiation, for example 1064 nm radiation from a Nd-YAG laser. However, other materials which absorb other wavelength radiation e.g. 488 nm radiation from a Ar-ion laser source, may be used with the radiation being converted to heat.

The radiation absorbing compound may usefully be a pigment, which is a black body or broad band absorber. It may be carbon such as carbon black or graphite. It may be a commercially available pigment such as Heliogen Green as supplied by BASF or Nigrosine Base NG1 as supplied by NH Laboratories Inc or Milori Blue (C.I. Pigment Blue 27) as supplied by Aldrich.

The radiation absorbing compound may usefully be an infra-red absorbing dye able to absorb the radiation selected for imaging and convert it to heat.

Preferably the infra-red absorbing compound is one whose absorption spectrum is significant at the wavelength output of the laser which is (in preferred embodiments) to be used in the method of the present invention. Usefully it may be an organic pigment or dye such as phthalocyanine pigment. Or it may be a dye or pigment of the squarylium, merocyanine, cyanine, indolizine, pyrylium or metal dithioline classes.

Examples of Such Compounds are:

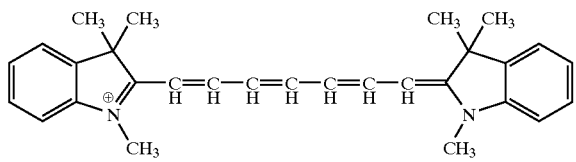

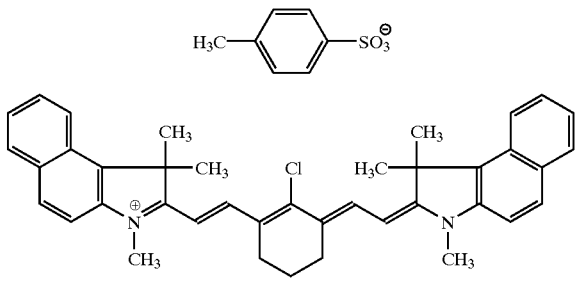

and KF 654B PINA as supplied by Riedel de Haan UK, Middlesex, England, believed to have the structure:

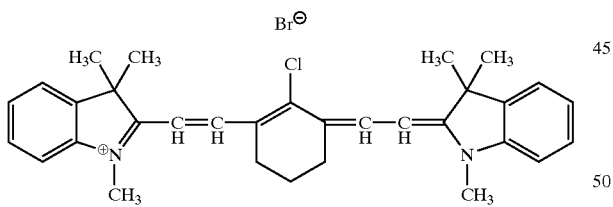

Pigments are generally insoluble in the compositions and so comprise particles therein. Generally they are broad band absorbers, preferably able efficiently to absorb electromagnetic radiation and convert it to heat over a range of wavelengths exceeding 200 nm, preferably exceeding 400 nm. Generally they are not decomposed by the radiation. Generally they do not have any marked effect on the solubility of the unheated composition, in the developer. In contrast dyes are generally soluble in the compositions. Generally they are narrow band absorbers, typically able efficiently to absorb electromagnetic radiation and convert it to heat only over a range of wavelengths typically not exceeding 100 nm, and so have to be selected having regard to the wavelength of the radiation which is to be used for imaging. Frequently they have a marked effect on the solubility of the unheated composition in the developer, typically making it much less soluble.

Suitably the radiation absorbing compound, when present, constitutes at least 0.25%, preferably at least 0.5%, more preferably at least 1%, most preferably at least 2%, of the total weight of the composition. Suitably the radiation absorbing compound, when present, constitutes, up to 25%, preferably up to 20%, and most preferably up to 15%, of the total weight of the composition. More specifically, in the case of dyes the range may preferably be 0.25–15% of the total weight of the composition, preferably 0.5–8%, whilst in the case of pigments the range may preferably be 1–25%, preferably 2–15%. For pigments, 5–15% may be especially suitable. In each case the figures given are as a percentage of the total weight of the dried composition. There may be more than one radiation absorbing compound. References herein to the proportion of such compound(s) are to their total content.

In one preferred embodiment of the invention an additional layer comprising a radiation absorbing compound can be used. This multiple layer construction can provide routes to high sensitivity as larger quantities of absorber can be used without affecting the function of the imaging forming layer. In principle any radiation absorbing material which absorbs sufficiently strongly in the desired wavelength can be incorporated or fabricated in a uniform coating. Dyes, metals and pigments (including metal oxides) may be used in the form of vapour deposited layers, techniques for forming and use of such films are well known in the art, for example EP 0,652,483.

Compounds which reduce the aqueous developer solubility of the polymeric substance and are also radiation absorbing compounds suitable for one embodiment of the present invention are preferably cyanine dyes and most preferably quinolinium cyanine dyes which absorb at above 600 nm.

Examples of Such Compounds are:

2-[3-chloro-5-(1-ethyl-2(1H)-quinolinylidene)-1,3-pentadienyl]-1-ethylquinolinium bromide

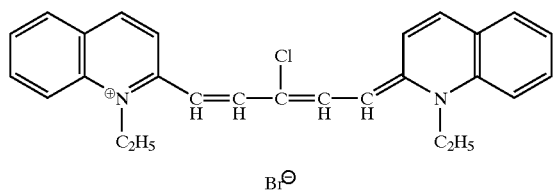

1-ethyl-2-[5-(1-ethyl-2(1H)-quinolinylidene)-1,3-pentadienyl]quinolinium iodide

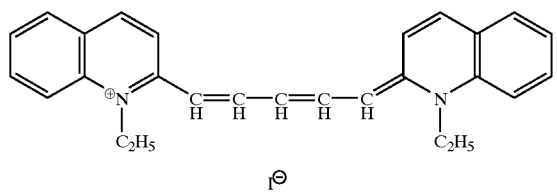

4-[3-chloro-5-(1-ethyl-4(1H)-quinolinylidene-1,3-pentadienyl]-ethylquinolinium iodide

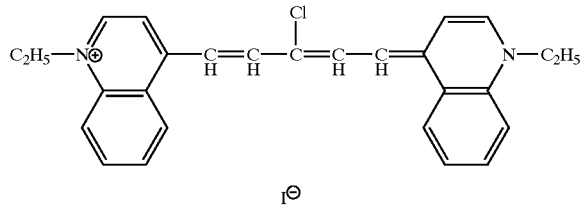

1-ethyl-4-[5-(1-ethyl-4 (1H)-qunoinyidene-1,3-pentadienyl]quinolinium iodide

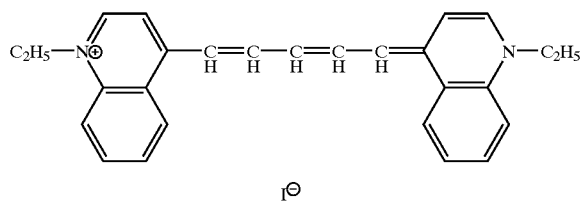

Suitably the reversible insolubiliser compound which is also a radiation absorbing compound constitutes at least 1%, preferably at least 2%, preferably up to 25%, more preferably up to 15%, of the total weight of the composition. Thus a preferred weight range for the reversible insolubiliser compound which is also a radiation absorbing compound may be expressed as 2–15% of the total weight of the composition.

The compositions of the invention may contain other ingredients such as stabilising additives, surfactants, plasticisers, inert colourants, additional inert polymeric binders as are present in many radiation sensitive compositions.

Preferably the heat-sensitive compositions of the present invention do not comprise UV sensitive components. However, UV sensitive components which are not UV activated due to the presence of other components, such as inert UV absorbing dyes or a UV absorbing topmost layer, may be present.

It is important that the entire surface of the precursor before development is covered by the heat-sensitive composition, and that the non-heated areas of the surface after development remain covered.

Preferably the mean peak to valley height Rz (as measured by test DIN 4777) of the surface of the precursor to which the composition is applied is less than 5 $\mu$m, preferably less than 2 $\mu$m (when measured in any direction).

It is found that by carrying out a suitable heat treatment after the application of a composition of this invention to a said surface but before delivering said heat the sensitivity of certain compositions of this invention may be rendered less variable, over time.

In general terms it may be stated that such a heat treatment, when carried out, should employ an elevated temperature, for an extended period; but the range of effective conditions, and the optimal conditions to achieve a substantially constant sensitivity over time, and at a practicable level, will vary from case to case, and can readily be determined by trial and error. We believe that a suitable heat treatment accelerates the formation of a stable network structure within the composition. If the elevated temperature is too low we believe the time required for this stable network structure to form is too long to be practicable. Furthermore in relation to the minimum suitable temperature it should be borne in mind that the elevated temperature should desirably not be less than that which the precursor might typically be subjected to in transit or in storage, or otherwise changes in sensitivity may occur. Consequently we favour carrying out the heat treatment at a temperature of at least 40° C., preferably at least 45° C., most preferably at least 50° C. As regards the upper limit, we believe that at too high a temperature the time for which the heat treatment should be carried out in order to obtain a desired level and stability of sensitivity is likely to be overly critical, and that even when the sensitivity is adequately stable, it is likely to be too low to be of use. Again, trial and error can easily be used to make this determination but as a guide we favour using a temperature not in excess of 90° C., preferably not in excess of 85° C., most preferably not in excess of 60° C. We believe that temperatures in the range 50–60° C. (inclusive) may be favoured.

The time for such a heat treatment can also be determined by trial and error. Generally, the lower the temperature for the heat treatment, the longer the time should be. In all cases however in which a heat treatment is carried out, we favour carrying it out for at least 4 hours; and preferably for at least 24 hours and most preferably for at least 48 hours, especially in the case of the lower temperatures.

The time and temperature conditions for the heat treatment may be contrasted with the time and temperature conditions for the prior step of drying the composition on the precursor. The heat treatment step preferably employs a lower temperature and a longer time, than the drying step. In the drying step the aim is to "flash dry" the composition. The time may typically be 15–600 seconds, especially 25–250 seconds and the temperature may typically be at least 70° C., suitably 80–150° C., especially 90–140° C. The drying step should be carried out until the coating is self-supporting and dry to the touch. However it is not necessary (and may not even be possible) to remove all the solvent, in the drying step (or in the later heat treatment step, when carried out). Indeed the residual solvent content may be regarded as an additional composition variable by means of which the composition may be optimised, as we have found that higher amounts of solvent may be beneficial in the later patternwise exposure and development process; compositions with higher amounts of retained solvent appear to be more sensitive than corresponding compositions with lower amounts of retained solvent.

The time and temperature conditions for the heat treatment, when carried out, may also be contrasted with the delivery of heat during the later exposure method, whereby heat is selectively delivered to a precursor of the mask or electronic part, the latter delivery of heat being of very short duration and very high intensity.

Preferably the sensitivity of the preferred compositions should be at a practicable level but suitably no more than 600 mJcm$^{-2}$, preferably no more than 400 mJcm$^{-2}$, more preferably no more than 250 mJcm$^{-2}$ most preferably no more than 200 mJcm$^{-2}$.

Any feature of any aspect of the present invention or embodiment described herein may be combined with any feature of any other aspect of any invention or embodiment described herein.

The following Examples more particularly serve to illustrate the various aspects of the present invention described hereinabove.

The following products are referred to hereafter:

Resin A—LB6564—a phenol/cresol novolac resin marketed by Bakelite, UK, believed to have the structure:

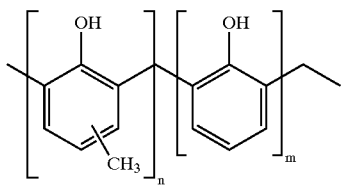

wherein n=m;

Resin B: LB744—a cresol novolac resin marketed by Bakelite, UK, believed to have the structure:

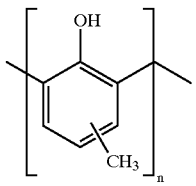

Resin C: SD-494A—a 53:47 meta:ortho cresol novolac resin marketed by Borden Chemicals of Southampton, UK.

Dye A—KF654B PINA as supplied by Riedel de Haan UK, Middlesex, UK, believed to have the structure:

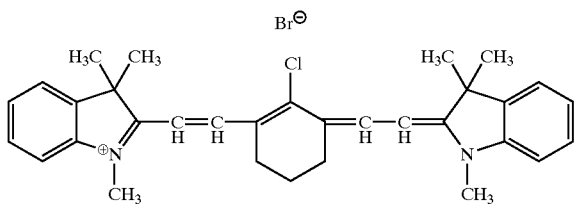

Dye B—crystal violet (basic violet 3,C.I.42555, Gentian Violet) as supplied by Aldrich Chemical Company of Dorset, UK, having the structure:

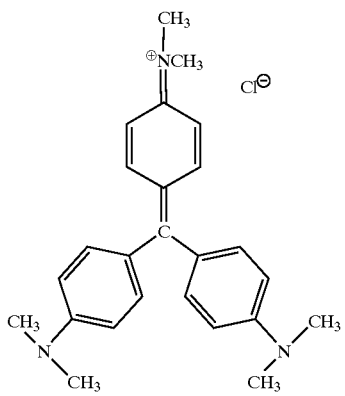

Oilsol Yellow DEA, (N,N-diethyl-P-(phenylazo) benzeneamine).

Alizarin Yellow GG—the sodium salt of 5-(3-nitrophenylazo)salicylic acid, supplied by Aldrich.

Prussian Blue (ferric ferrocyanide, CI Pigment Blue 27) supplied by Aldrich Chemical Company, Dorset, UK.

Carbon Black FW2—a channel type carbon black supplied by Degussa, Macclesfield, UK.

PVEE—Poly(vinylethylether) supplied by Aldrich Chemical Company, Dorset, UK.

Etching Solution A—Ferric chloride hexahydrate ($FeCl_3.6H_2O$) crystals, catalogue No. 551-227 as supplied by RS Components, Corby, UK.

Stripper A—catalogue No. 690-855 as supplied by RS Components, Corby, UK.

Stripper B—acetone.

Developer A—14 wt % sodium metasilicate pentahydrate in water.

Developer B—7.5 wt % sodium metasilicate pentahydrate in water.

Copper Substrate A—double sided copper laminate, having copper cladding 18 μm thick, catalogue number N4105-2, 0.008, H/H HTE, as supplied by New England Laminates (UK) Limited of Skelmersdale, UK. In all cases this was brush grained using a mechanical brush grainer, stock number 4428, supplied by PCB Machinery Limited, Haslingden, Rossendale, UK, rinsed with distilled water for 10 seconds and allowed to air dry, prior to coating.

Talyscan profilometer—a fast 3D texture scanning system comprising of a scanning head, interface box and IBM compatible PC driven by Talyscan Classic software as supplied by Rank Taylor Hobson Limited, Leicester, UK.

Creo Trendsetter 3244—a commercially available plate setter, using Procomm Plus Software, operating at a wavelength of 830 nm at powers of up to 8 W and supplied by Creo Products Inc. of Burnaby, Canada.

Oyo thermal plotter—a GS618-400 thermal plotter, as supplied by Oyo Instruments Inc., of Houston, Tex., USA.

Horsell Mercury Mark V Processor—a commercially available processor as supplied by Kodak Polychrome Graphics, Leeds, UK.

EXAMPLES 1 to 8

Coating formulations of Examples 1–8 below were prepared as solutions in 1-methoxypropan-2-ol. The substrate used was Copper Substrate A. The coating solutions were coated onto the support by means of a wire wound bar. The solution concentrations were selected to provide the specified dry film compositions with a coating weight of 2.4 $gm^{-2}$ after thorough drying at 130° C. for 80 seconds.

The compositions were as set out in Table 1 below.

TABLE 1

| | Examples | | | | | | | |
|---|---|---|---|---|---|---|---|---|
| Component | 1 | 2 | 3 | 4 | 5 | 6 | 7 | 8 |
| Resin A | 92 | | | 91 | | | 94 | |
| Resin C | | 96 | | | 95 | | | 93 |
| Resin B | | | 97.5 | | | 97 | | |
| Dye A | 2 | 2 | 2 | 2 | 2 | 2 | 2 | 2 |
| Dye B | 6 | 2 | 0.5 | 7 | 3 | 1 | 4 | 5 |

Samples of the printed circuit precursors were then imaged using internal test patterns on the Creo Trendsetter 3244.

The exposed printed circuit precursors were then processed by immersing in Developer A for 30 seconds at 22° C. Plate sensitivities were then determined by assessing the minimum energy which gave good development, of the range of exposure energies supplied by the image setter. The results are listed in Table 2 below.

TABLE 2

| Example | Sensitivity (mJcm$^{-2}$) |
|---|---|
| 1 | 250 |
| 2 | 250 |
| 3 | 250 |
| 4 | 350 |
| 5 | 350 |
| 6 | 350 |
| 7 | 400 |
| 8 | 600 |

The boards were then etched (uncovered copper removed) by immersion in Etching Solution A diluted with water (50% w:w) which was constantly stirred for between 5 and 10 minutes at 40° C. The boards were then rinsed in water.

Finally the boards were cleaned by immersion in Stripper A diluted with water (20% w:w) at 20° C. for 30 to 120 seconds to remove the remaining novolac.

All printed circuit samples had copper tracks remaining that were accurate copies of the test patterns.

EXAMPLE 9

The coating formulation for Example 9 set out in Table 3 below was prepared in 1-methoxypropan-2-ol. This was coated onto Copper Substrate A by means of a wire wound bar. The solution concentrations were selected to provide the specified dry film compositions with a coating weight of 4.0 gm$^{-2}$ after thorough drying at 130° C. for 80 seconds.

TABLE 3

| Component | Example 9 Parts by Weight |
|---|---|
| Resin A | 92.5 |
| Dye A | 2 |
| Dye B | 5.5 |

A sample of the printed circuit precursor was then imaged by the same image setter, the Creo Trendsetter, using internal test patterns with an energy of 150 mJcm$^{-2}$.

The exposed printed circuit precursor was then processed by passing it through a PCB processor consisting of developer, rinse and etch tanks as supplied by BBH Windings Limited of Durham, UK, with the following settings

| Developer tank | 20 ± 50° C., for 5 seconds containing Developer A |
| Rinse tank | room temperature |
| Etch tank | 50 ± 5° C., for 7 minutes 50% (w:w) water solution of Etching Solution A |
| Rinse tank | room temperature |

Finally the printed circuit board precursor was cleaned by immersion in Stripper B at 20° C. for 30 seconds.

The printed circuit board sample had copper tracks remaining only in the non-imaged areas, and having a resolution of 25 microns.

EXAMPLE 10

The coating formulation for Example 10, set out in Table 4 below, was prepared as a solution in 1-methoxypropan-2-ol/xylene 98:2 (v:v). The coating solutions were coated onto 0.3 mm aluminium sheet by means of a wire wound bar. The solution concentrations were selected to provide the specified dry film compositions with a coating weight of 2.5 gm$^{-2}$ after thorough drying at 100° C. for 3 minutes.

TABLE 4

| Component | Example 10 Parts by Weight |
|---|---|
| Resin A | 66 |
| Resin B | 30 |
| Dye A | 2 |
| Dye B | 2 |

Individual samples were then covered with interleaving (a polythene coated paper No. 22, 6 gm$^{-2}$ as supplied by Samuel Grant, U.K.), wrapped in paper (unbleached, unglazed Kraft 90 gm$^{-2}$, coated with matt black low density polythene 20 gm$^{-2}$ as supplied by Samuel Grant, U.K.) and placed in an Gallenkamp hotbox oven with fan, size 2, as supplied by Sanyo Gallenkamp plc of Leicester, U.K., at 50° C. for 0, 2, 3, 5 and 12 days respectively.

As an indication of the suitability of the composition for use in a method of making printed circuits the resulting heat treated samples were imaged using the Creo Trendsetter at 7 watts with a 50% screen image at imaging energy densities of 120, 140, 160, 180, 200 and 220 mJcm$^{-2}$. The samples were developed using a Horsell Mercury Mark V plate processor containing Developer A at 22° C. The processing speed was set at 1000 mm min$^{-1}$. Finally, images produced were evaluated visually and the energy required to produce a 50% imaged sample was recorded (mJcm$^{-2}$). The results are set out in Table 5 below.

TABLE 5

| | Number of days plate samples resided in oven at 50° C. | | | | |
|---|---|---|---|---|---|
| | 0 | 2 | 3 | 5 | 12 |
| Energy required to produce 50% image/mJcm$^{-2}$ | No coating retained | 140–160 | 160–180 | 160–180 | 160–180 |

The results for samples having had heat treatments lasting 2–12 days indicate good suitability for imaging the patterns involved in printed circuit board manufacture, on metallic substrates, and in mask manufacture, on plastics substrates.

EXAMPLE 11

The formulation set out in Table 6 was barrel rolled for 1 hour before coating:

TABLE 6

| Component | % w/w |
|---|---|
| Resin A (40% wt in 1-methoxypropan-2-ol) | 38.1 |
| Resin B (40% wt in 1-methoxypropan-2-ol) | 14.0 |
| Dye A (5% wt in 1-methoxypropan-2-ol) | 8.8 |
| Dye B (3% wt in 1-methoxypropan-2-ol) | 14.7 |
| 1-Methoxypropan-2-ol | 24.4 |

The support used was 0.3 mm aluminium sheet. The coating solution above was coated onto the support by means of a wire wound bar. The solution concentration was selected to provide a coating weight of 2.1 gm$^{-2}$ after thorough drying at 100° C. for 3 minutes. The composition was then heat treated for 2 days at 50° C. in a Gallenkamp hotbox oven with fan, size 2, as supplied by Sanyo Gallenkamp plc of Leicester, UK.

The formulation from above was imaged at 51, 56, 60, 64, 69, 73, 77 and 81 mJcm$^{-2}$ using the Creo Trendsetter 3244 and then developed using a Horsell Mercury mark V processor containing Developer A at 22° C. at a processing speed of 2000 mm min$^{-1}$.

After processing the area exposed to the highest imaging energy density had completely developed off and the lowest imaging energy density exposed area had not developed off at all. The imaging energies in between showed a continuum of development between these two extremes, as seen as a change in colour strength.

UV/vis Analysis

The processed compositions were then analyzed using a Perkin-Elmer lambda-16 uv/vis spectrometer and its integrating sphere attachment. Results are in Table 7 below.

TABLE 7

| Imaging energy Density (mJcm$^{-2}$) | Absorbance at 600 nm |
|---|---|
| 0 | 1.75 |
| 51 | 1.48 |
| 56 | 1.22 |
| 60 | 1.05 |
| 64 | 0.85 |
| 69 | 0.54 |
| 73 | 0.42 |
| 77 | 0.27 |
| 81 | 0.18 |

From these results it can be seen that the absorbance and hence the filmweight of the coated composition decrease with increasing imaging energy density.

Talyscan Profilometer

The thickness of each edge of each image produced above was assessed using a Talyscan profilometer. Results are in Table 8 below.

TABLE 8

| Imaging Energy Density (mJcm$^{-2}$) | Height Difference (nm) |
|---|---|
| 81 | 1340 |
| 77 | 977 |
| 73 | 610 |
| 69 | 598 |
| 0 | 0 |

Therefore these results show it to be possible to heat mode image and develop coatings to produce films having a variety of thicknesses, as required for certain types of mask.

EXAMPLE 12

The coating formulation of Example 11 was coated onto Planfoil polyester montage foil (0.18 mm thickness) as supplied by Horsell of Leeds, UK. The coating solution was coated onto the support by means of a wire wound bar. The coating solution was selected to provide a coating weight of 2.1 gm$^{-2}$ after thorough drying at 100° C. for 3 minutes. The composition was then heat treated for 2 days at 50° C. in the Gallenkamp oven described above.

The formulation from above was imaged at 51, 56, 60, 64, 69, 73, 77 and 81 mJcm$^{-2}$ using the Creo Trendsetter 3244 and then developed using a Horsell Mercury mark V processor containing Developer A at 22° C. at a processing speed of 2000 mm min$^{-1}$.

After processing, the thickness of each edge of each image produced was assessed using the Talyscan profilometer. Results are in Table 9 below.

TABLE 9

| Imaging Energy Density (mJcm$^{-2}$) | Height Difference (nm) |
|---|---|
| 81 | 1340 |
| 77 | 1260 |
| 73 | 818 |
| 69 | 800 |
| 0 | 0 |

Again it can be seen from these results that it is possible to heat mode image and develop coatings to produce films having a variety of thicknesses.

EXAMPLE 13

The coating formulation set out in Table 10 was barrel rolled for 5 hours before coating:

TABLE 10

| Component | % w/w |
|---|---|
| Resin A | 20.25 |
| Prussian Blue | 1.325 |
| Oilsol Yellow DEA | 2.275 |
| Alizarin Yellow GG | 1.15 |
| 1-Methoxypropan-2-ol | 75 |

The support used was Planfoil montage foil (0.18 mm thickness) as supplied by Horsell of Leeds, UK. The coating formulation above was coated onto the support by means of a wire wound bar. The solution concentration was selected to provide a coating weight of 3.0 gm$^{-2}$ after thorough drying at 100° C. for 3 minutes. The masks were then heat treated for 3 days at 55° C.

Imaging

The polyester mask was imaged at 300 mJcm$^{-2}$ using the Creo Trendsetter 3244 and processed by hand in Developer B at 20° C. for 60 seconds. It was found that the thermally sensitive coating dissolved away in the developer where the laser had struck it. The mask was then allowed to air dry for 30 minutes.

Use as a Mask

The mask from above was laid over a Horsell Capricorn DH positive working printing plate precursor and the whole assembly was exposed on a Montakop UV lightframe using a TH 3020 diazo bulb supplied by Siegfried Theimer GmbH of Germany. (This emits UV radiation predominantly distributed in the wavelength band 400–440 nm). The number of exposure units used was 100 with a 20:20 vacuum. The exposed Capricorn DH plate was processed by immersing in Developer B at 20° C. for 60 seconds. The Capricorn DH coating dissolved away in the developer where the UV radiation had passed through the mask, to leave a binary image.

EXAMPLE 14

The coating formulation set out in Table 11 below was prepared as a solution in 1-methoxypropan-2-ol. The support used was Planfoil polyester montage foil (0.18 mm thickness) as supplied by Horsell of Leeds, UK. The coating solution was coated onto the support by means of a wire wound bar. The solution concentration was selected to provide a coating weight of 2.1 $gm^{-2}$ after thorough drying at 100° C. for 3 minutes.

TABLE 11

| Component | Parts by weight |
|---|---|
| Resin A | 70 |
| Resin B | 28 |
| Dye B | 2 |

The compositions were then heat treated for 3 days at 55° C. using the Gallenkamp oven.

The composition was then imaged on the oyo thermal plotter using the following conditions:

1. 400×800 dpi 2. and power set at 50% of the maximum internal figure, and then processed by hand in Developer B at 20° C. for 15 seconds.

It was found that the thermally sensitive coating dissolved away in the developer where it had received a direct application of heat.

EXAMPLE 15

The coating formulation of Example 15 as set out in Table 12 below was prepared as a solution in 1-methoxypropan-2-ol. The substrate used was Copper Substrate A. The coating solution was coated onto the substrate by means of a wire wound bar. The solution concentration was selected to provide the specified dry film composition with a coating weight of 3.5 $gm^{-2}$ after thorough drying at 130° C. for 120 seconds.

TABLE 12

| Component | Parts by weight |
|---|---|
| Resin A | 81 |
| Dye B | 1 |
| PVEE | 15 |
| Carbon Black FW2 | 3 |

A sample of the printed circuit board precursor was then imaged on the Creo Trendsetter 3244, using an internal test pattern at 8 W, 300 $mJcm^{-2}$, 68 rpm.

The exposed precursor was then processed using a Mercury Mark V processor containing Developer A at 22.5° C., with a process speed of 1000 mm/min. The 50% dots laid down by the platesetter produced complete 50% dots on the printed circuit board.

EXAMPLE 16

The surface morphology of the Copper Substrate A was tested. Measurements were taken with a Hommel Tester 500 using a stylus with a 90° cone angle and a 5 micron tip.

Where there appeared to be a grain, ie a rolling direction from manufacture, measurements were taken along and against (perpendicular to, on the same plane) the grain. The surface roughness parameters Ra and Rz were measured in accordance with DIN test 4777 and the instructions given with the instruction manual issued by Hommelwerke GmbH with the Hommel Tester T500. They are defined therein as follows:

| Ra | Arithmetic mean roughness value | Arithmetic mean of the profile deviation of the filtered roughness profile from the center line within the measuring length. |
|---|---|---|
| Rz | Mean peak to valley height | Arithmetic means from the peak to valley heights of 5 successive sampling lengths in filtered roughness profile. |

The tests were carried out three times and the results are given in Table 13 below.

TABLE 13

| Measurement direction | Ra 1 | Ra 2 | Ra 3 | Rz 1 | Rz 2 | Rz 3 |
|---|---|---|---|---|---|---|
| with grain | 0.18 | 0.18 | 0.18 | 1.42 | 1.26 | 1.46 |
| against grain | 0.22 | 0.26 | 0.22 | 1.82 | 1.46 | 1.84 |

In the specification we refer in various places to UV and infra-red radiation. A person skilled in the art will be aware of the typical wavelength ranges of these radiations, and that there may be latitude at the margins of these ranges, and also that many sources emit a distribution of wavelengths. However, UV radiation typically has a wavelength range not exceeding about 450 nm. Infra-red radiation typically has a wavelength range of at least 600 nm. When we state in this specification that radiation is not UV-radiation we mean that any UV components of the wavelength distribution are minor, not significantly affecting the method. Likewise when we state that radiation is, for example, predominantly infrared radiation we mean that whilst there may be non-infrared components in the wavelength distribution these are not significant, in the method.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

What is claimed is:

1. A method of making an electronic part, the method comprising:

a) delivering heat selectively to regions of a precursor of the electronic part, the precursor comprising a surface coated with a coating, the coating comprising a heat-sensitive composition itself comprising an aqueous developer soluble polymeric substance and a compound which reduces aqueous developer solubility of the polymeric substance, wherein aqueous developer solubility of the composition is not increased by incident UV radiation but is increased by the delivery of heat; and b) developing the electronic part precursor in an aqueous developer in order to remove the heat-sensitive composition at regions to which the heat was delivered.

2. A method as claimed in claim 1 wherein the aqueous developer soluble polymeric substance comprises a functional group or groups selected from hydroxy, carboxylic acid, amino, amide and maleiimide.

3. A method as claimed in claim 1 wherein the aqueous developer soluble polymeric substance is selected from a polymer or copolymer of hydroxystyrene, a polymer or copolymer of acrylic acid, a polymer or copolymer of methacrylic acid, a polymer or copolymer of maleiimide, a polymer or copolymer of maleic anhydride, a hydroxycellulose, a carboxy cellulose and a phenolic resin.

4. A method as claimed in claim 1 wherein the aqueous developer soluble polymeric substance is a phenolic resin.

5. A method as claimed in claim 1 wherein the precursor comprises an insulating substrate supporting said surface.

6. A method as claimed in claim 1 wherein the surface is a conductive surface and the removal of the heat-sensitive composition is complete, at the heated regions.

7. A method as claimed in claim 6, comprising the step, after said developing step b), of etching the precursor in an etchant to remove the conductive surface at the regions from which the heat-sensitive composition was removed.

8. A method as claimed in claim 1, wherein the surface is a semiconductor surface.

9. A method as claimed in claim 8, wherein the semiconductor surface comprises revealed regions, the method comprising the step, after developing step b), of doping the revealed regions.

10. A method as claimed in claim 7, comprising the step, subsequent to the etching, of removing the remaining areas of the heat-sensitive composition.

11. A method as claimed in claim 10, wherein the removing step comprises applying a stripper liquid to the electronic part.

12. A method as claimed in claim 1, wherein radiation is delivered to said precursor, wherein said coating absorbs such radiation and converts it to heat.

13. A method as claimed in claim 12 wherein said coating comprises a radiation absorbing compound which absorbs the radiation and converts it to heat.

14. A method as claimed in claim 13, wherein the coating comprises a compound which reduces the aqueous developer solubility of the polymeric substance, and functions as a radiation absorbing compound.

15. A method as claimed in claim 12, wherein the radiation is delivered from a laser.

16. A method as claimed in claim 15 wherein the laser emits radiation at above 600 nm.

17. A method as claimed in claim 1 wherein the heat is delivered from a heated body.

18. A precursor for an electronic part which comprises a surface which is not an aluminum surface which has undergone electrograining, anodising and post-anodic treatments and a coating comprising a heat-sensitive composition coated on the surface, the heat-sensitive composition comprising an aqueous developer soluble polymeric substance and a compound which reduces the aqueous developer solubility of the polymeric substance, wherein the aqueous developer solubility of the composition is increased on heating and the aqueous developer solubility of the composition is not increased by incident UV radiation.

19. A precursor for an electronic part as claimed in claim 18, wherein the surface is of copper or a copper-rich alloy.

20. A precursor as claimed in claim 18, wherein said composition is not oleophilic.

21. A precursor as claimed in claim 18, wherein the method of manufacturing it comprises the application of the heat-sensitive composition in a solvent to the surface, the drying of the heat-sensitive composition, and the subsequent heat treatment of the coated surface bearing the dried heat-sensitive composition.

22. A precursor as claimed in claim 21, wherein the heat treatment is carried out at a temperature in the range 40–90° C. for at least 4 hours.

23. A method as claimed in claim 9, comprising the step, subsequent to said doping, of removing the remaining areas of the heat-sensitive composition.

* * * * *